United States Patent [19]
Nakai et al.

[11] Patent Number: 4,825,256
[45] Date of Patent: Apr. 25, 1989

[54] IMAGE RECORDING DEVICE

[75] Inventors: Hitoshi Nakai; Takemi Yamamoto; Jun Sakai, all of Nagoya; Eiji Fujii, Gifu, all of Japan

[73] Assignee: Brother Kogyo Kabushiki Kaisha, Japan

[21] Appl. No.: 159,296

[22] Filed: Feb. 23, 1988

[30] Foreign Application Priority Data

Feb. 24, 1987 [JP] Japan .................................. 62-41182

[51] Int. Cl.⁴ ........................ G03B 27/32; G03B 27/52
[52] U.S. Cl. ........................................ 355/27; 355/3 R; 355/32; 430/138; 346/150
[58] Field of Search ................................. 346/150, 160.1; 355/3 R, 13, 27, 32, 35; 430/138

[56] References Cited
U.S. PATENT DOCUMENTS 4,785,316 11/1988 Yamamoto et al. .............. 346/150

*Primary Examiner*—Richard A. Wintercorn
*Attorney, Agent, or Firm*—Kane, Dalsimer, Sullivan, Kurucz, Levy, Eisele and Richard

[57] ABSTRACT

An image recording device wherein a photo-sensitive paper or a plain paper is selected as a recording medium. If a monochrom image is to be recorded, a provisional image formed with light-shield materials which corresponds to an original image to be recorded is directly transferred onto the plain paper to form a monochrom image thereon. If a color image is to be recorded, the light-shield image is once transferred onto an image carrier, and the light-shield image carried on the image carrier is exposed on the photo-sensitive paper to form a latent image thereon. The latent image formed on the photo-sensitive paper by the above exposure is then developed to a visible color image.

10 Claims, 6 Drawing Sheets

IMAGE RECORDING DEVICE

BACKGROUND OF THE INVENTION

This invention relates to an image recording device and more particularly to an image recording device which performs image recording through formation of a latent image on a photo-sensitive composition.

There has been known such an image recording device in which a latent image formed on a circumferential surface of a photo-conductive drum is developed to a visible image with charged particles called toners, and the resultant toner image formed on the drum is then transferred and set on a plain paper for recording the image thereon. In recent years, image recording devices of this type are becoming widely available as laser printers where writing a latent image on the photo-conductive drum is carried out by a laser scanner, and as electronic copying machines where a latet image is formed with light reflections from a text or image to be copied.

In the meantime, it has been proposed, as disclosed in the U.S. Ser. No. 50,313 filed on May 14, 1987, to obtain a longer service life of the photo-sensitive composition as well as added facilities of printing and copying (e.g. in full-color) through combination of the advantages of the latent image formation scheme as mentioned above with the use of the photo and pressure sensitive paper. In more particular, the image recording device ensures a longer life of the photo-sensitive composition by developing the latent image formed on the photo-sensitive composition with light-shield materials, then transferring the developed image onto a transparent film and exposing the photo and pressure sensitive paper through this transparent film instead of the photo-sensitive composition, while providing color printing and copying by repeating this procedure for every primary color.

While the image recording device utilizing the photo and pressure sensitive paper has brought the above advantages, further improvements have been desired. That is, although an important feature of the image recording device utilizing the photo and pressure sensitive paper resides in provision of color printing and copying with practical cost, device and arrangement, if one wants to have a simple black and white print or copy in the above image recording device, exposure to three primary colors of yellow, magenta and cyan is still to be done to provide "black" as the result of subtractive process. This has resulted in a problem that providing a monochrom image has taken the same length of time as for color image. Moreover, the time required for recording a monochrom image becomes longer than the prior ways because exposure takes place after transferring the image onto the transparent film, whereupon the film must be brought to a complete stop in the above image recording device. So this problem has been too serious to be overlooked when a simple black and white image is enough for the purpose.

SUMMARY OF THE INVENTION

It is therefore an object of the invention to provide an improved image recording device capable of reducing the time required for recording a monochrome image while color image recording can be carried out.

For the above purpose, according to this invention, there is provided an image recording device comprising: select means for selecting either a photo-sensitive paper or a plain paper as a recording medium; light-shield image forming means for forming a provisional image with light-shield materials; monochrom image forming means for forming a monochrom image on said plain paper by transferring said light-shield image onto said plain paper if said plain paper is seleced as the recording medium by said select means; and color image forming means for forming a color image on said photo-sensitive paper by exposing said light-shield image onto said photo-sensitive paper if said photo-sensitive paper is selected as the recording medium. In actual operation, said exposure is repeatedly carried out for three primary-color images.

With the above constructed image recording device, with the selection of the recording medium, the light-shield image formed by said light-shield image forming means may be directly transferred onto the plain paper if a monochrom image is to be recorded. On the other hands, if a color image is to be recorded, the light-shield image is exposed onto said photo-sensitive paper.

Thus, if the recording of the monochrom image is required in the color imaging device, such processes as transferring of the provisional image onto the image carrier and/or repeated exposure utilizing the image carrier onto the recording paper which have been done in the prior arts can be completely eliminated, which resulted in very quick recording operation.

DESCRIPTION OF THE ACCOMPANYING DRAWINGS

DESCRIPTION OF THE EMBODIMENTS

Figure 1:
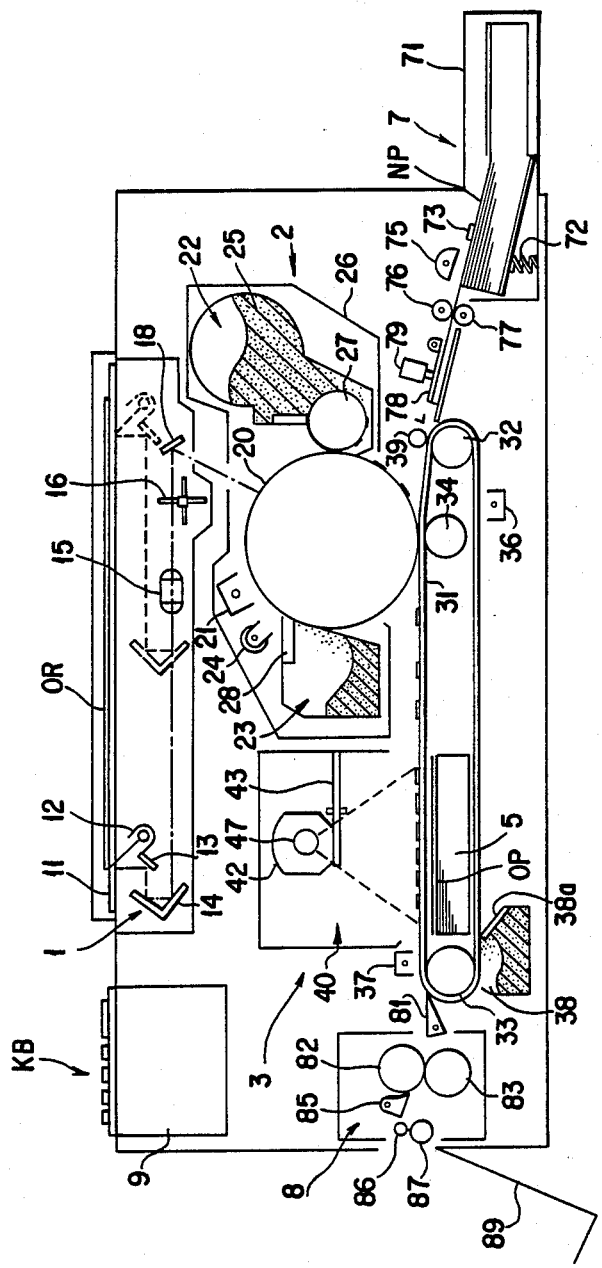
FIG. 1 is a shematic structural view of a copying machine embodying the invention.

FIG. 1 illustrated a copying machine embodying the invention, which comprises a scanner unit 1 for scanning an original OR to be copied, a Xerography unit 2 for formation and development of a latent image, an exposure unit 3 for exposure of a later-described photo and pressure sensitive paper OP, using the image provided by toners serving as light-shield materials, a first paper feed unit 5 for feeding, stopping and pressurising the paper OP, a second paper feed unit 7 for feeding an ordinal paper NP, a fixing unit 8 for fusing the toners onto the paper NP, and an electronic control unit 9 for controlling these units.

The scanner unit 1 comprises a lamp unit 12 for illuminating the original OR placed on a platen glass 11, a first and second mirrors 13, 14, a lens 15, a color separation filter 16 and a third mirror 18, which are provided in sequence to direct the reflections from the original OR to a photo-conductive drum 20 of the Xerography unit 2. The lamp unit 12, and the first and second mirrors 13 and 14 are moved by a drive mechanism, not shown, for optical scanning of the original OR. In order to keep constant the length of optical path between the original OR and the Xerography unit 2, the second mirror 14 is allowed to move only by half the lamp unit 12 and the first mirror 13.

The color separation filter 16 is provided with red, blue and green filter sections and a transparent section positioned at right angle to one another, and is turned through 90 degrees for every color in accordance with the signal from the electronic control unit 9 to separate the reflections from the original OR into color components. The transparent filter section has its transmission factor set to pass therethrough about the same amount of light as that passed through the individual color filter sections. This is used for monochrome copying.

The lens 15 is a spherical lens whose focal length is half the length of the optical path between the original OR and the photo-conductive drum 20. Through this lens 15, the reflections from the original OR are focused onto the photo-conductive drum 20 of the Xerography unit 2 after reflecting from the third mirror 18 of the scanner unit 1.

The Xerography unit 2 is provided with a corotron charger 21, a developing unit 22, a cleaning unit 23 and a discharging unit 24 all located around the drum 20. The bottom part of the drum 20 is in tangential contact with transparent film 31 of the exposure unit 3. The developing unit 22 consists of a toner case 26 containing toners 25 as light-shield materials and a developing sleeve 27 to whose surface the toners are uniformly applied. The developing sleeve 27 is in rotatable engagement with the drum 20.

The photo-conductive drum 20 is uniformly electro-statically charged by means of the corotron charger 21 and is then discharged with the light coming from the scanner unit 1 to form a latent image responsive to the pictorial information on the original OR. On the other hand, the toners 25 within the developing unit 22 are charged oppositely to the sign of charge applied by the corotron charger 21 so that the toners 25 are deposited onto the area which is not discharged, thus developing the latent image to a visible toner image.

Thus, most of the toners 25 deposited on the drum 20 are transferred at the contact area with the exposure unit 3. The toners on the drum 20 remaining untransferred are scraped off and collected by means of a cleaning blade 28 of the cleaning unit 23. The drum 20 is then exposed to a discharging lamp 24 to cancel the residual charge. Upon every single rotation of the drum 20, it is uniformly charged again with the corotron charger 21 for successive formation of latent images and developments thereof.

With the brief description of the arrangement and function of the Xerohraphy unit 2 as above, its detailed explanation is eliminated because the Xerography unit 2 itself is well known.

The exposure unit 3 consists of a transparent film 31 in the form of an endless belt, drive rollers 32 and 33 around which the transparent film 31 is wound, a transfer roller 34 for loading the transparent film 31 against the outer circumference of the photo-sensitive drum 20, a corotron charger 36 provided in opposition to the transparent film 31, a discharging collotron 37, a toner collecting unit 38 for collection of residual toners, a pressure roller 39, an illumination unit 40 for illuminating over the transparent film 31.

The transparent film 31 may of flexible Polyethylene Telephtalate (PET) with the thickness of about 70 to 200 $\mu$m and should be transmissive to the light with the wavelengths longer than at least $\lambda=350$ nm. In addition, the transparent film has high relative dielectic constant enough to be easily charged with the corotron charger 36. Uniform charging is to take place with a opposite sign of charge to the toner 25 on the photo-conductive drum 20. Accordingly, with rotation of the drum 20, the toners 25 on the drum 20 are transferred onto the transparent film 31 pressed against the drum 20 by means of the transfer roller 34. The transparent film 31 with the toners 25 transferred thereon is then passed via the route under the illumination unit 40 upon rotation of the drive rollers 32 and 33.

While the transparent film 31 is fed by the above mechanism, the first paper feed unit 5 is provided to feed the photo and pressure sensitive paper OP via the route under the illumination unit 40 in a direction perpendicular to the feed direction of the transparent film 31. On the other hand, the second paper feed unit 7 is located prior to the transparent film 31 in terms of its feeding direction to feed the plain paper NP onto the transparent film 31. Furthermore, the fixing unit 8 is provided to receive the plain paper NP conveyed on the transparent film 31 and carry it to the outlet.

Figure 2:
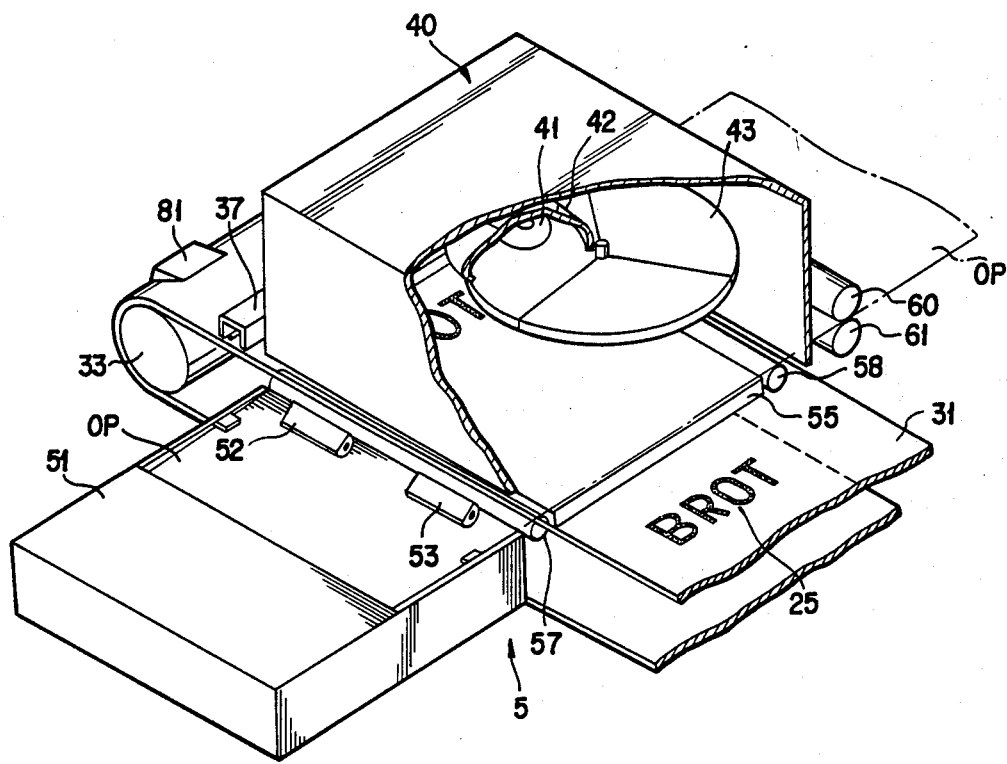
FIG. 2 is a perspective view showing the arrangement of an illumination unit and a photo and pressure sensitive paper feed unit.

Now, the arrangements of the first paper feed unit 5 and the illumination unit 40 are described with reference to FIG. 2 showing them in a perspective view.

Figure 3:
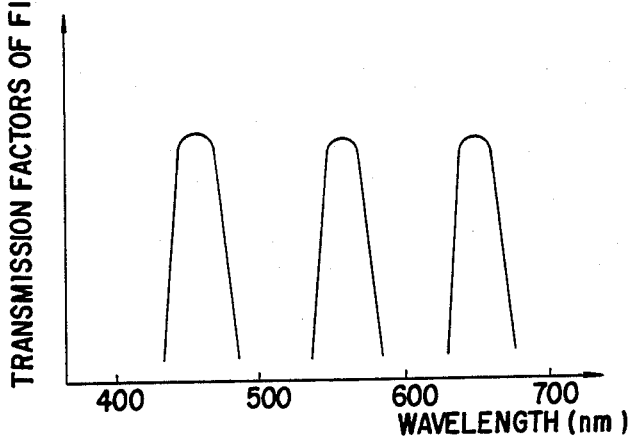
FIG. 3 is a graph showing transmission factors at different parts of a filter.

The illumination unit 40 includes a Xenon lamp 41 as an exposure lamp, a reflector 42 for condensing the light emitted from the exposure lamp 41 into the transparent film 31, and a filter 43 divided into three sectors which transmit red, green and blue light respectively. An example of the transmitting characteristics of the filter 43 is illustrated in FIG. 3.

The first paper feed unit 5 includes a paper cassette 51 storing the photo and pressure sensitive papers OP, feed rollers 52 and 53 which pick up the paper OP piece by piece from the paper cassette 51, a conveyer roller 57 which sends the picked up piece of paper OP to an electrostatic unit 55 provided under the transparent film 31 with a small clearance, another conveyer roller 58 which discharges the paper OP on the electrostatic unit 55 after its exposure from the feed unit 5, and a pair of pressure rollers 60 and 61 which apply pressure to the paper OP. The electrostatic unit 55 produces static electricity to hold the paper OP in position while the transparent film 31 is conveyed.

Figure 4:
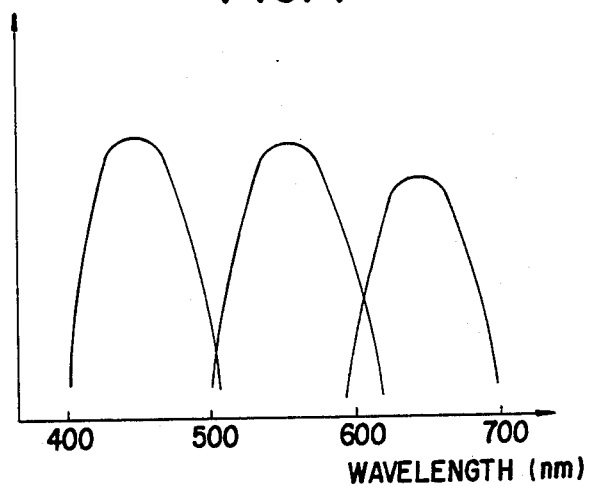
FIG. 4 is a graph showing spectral sensitivity characteristics of microcapsules on a photo and pressure sensitive paper.

In this embodiment, as the photo and pressure sensitive paper OP for color printing, such paper as disclosed in the U.S. Pat. No. 4,440,846 is used so that it carries on its surface microcapsules, each of which envelopes therein a chromogenic material for primary color of cyan, magenta or yellow as well as a photo-curable resin. Further, a developing agent which reacts to the above chromogenic material to develop a color is coated on the paper OP under said microcapsules. The spectral sensitivity characteristics of the paper OP provide, for instance, the peak sensitiviey of cyan at the wavelength $\lambda=650$ nm, the peak sensitivity of magenta at the wavelength $\lambda=550$ nm and the peak sensitivity of yellow at the wavelength $\lambda=450$ nm, as illustrated in FIG. 4.

Turning back to FIG. 1, the paper feed unit 7 provided prior to the transparent film 31 in its conveying direction, includes a cassette 71 storing a pile of plain papers NP, a spring 72 loading the paper NP upward, a guide 73 for limiting the upward movement of the papers loaded upward, a feed roller 75 which picks up the plain paper NP piece by piece through its rotation, a pair of conveyer rollers 76 and 77 for conveying the picked up paper NP, a registration gate 78 for positioning the leading edge of the paper NP, and a solenoid 79 for opening and closing the registration gate 78. When the registration gate 78 is open, the paper NP is thus sent onto the charged transparent film 31 with no inroad of air by the pressing roller 39. When the transparent film 31 is moved by the conveyer rollers 32 and 33, the paper NP sealed to the film 31 is also conveyed together with the film 31 to finally arrive at the fixing unit 8.

The fixing unit 8 includes, as shown in FIG. 1, a stripper finger 81 located in opposition to the area where the transparent film 31 is tangentially contact with the drive roller 33, a heat roller 82 having a built-in heater to fuse the toners on the paper NP, a pressing roller 83 located in opposition to the heat roller 82 across the conveying path of the paper NP for fusing the toners 25 in cooperation with the heat roller 82, a second stripper finger 85 associated with the heat roller 82 to peel off the paper NP, discharge rollers 86 and 87 to discharge the paper NP after fixing, and a discharge tray 89 which receives the paper NP being discharged.

Figure 5:
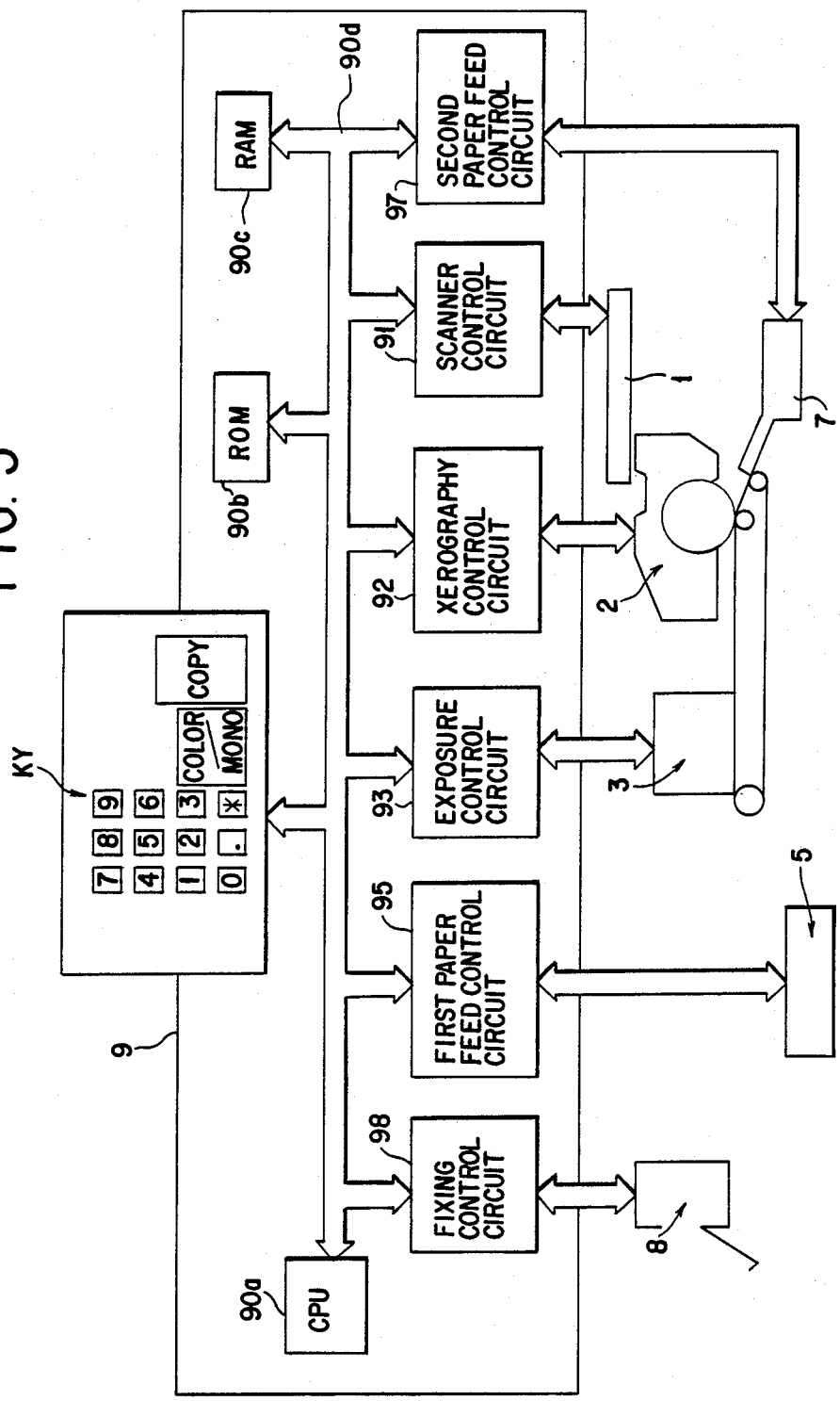
FIG. 5 is a block diagram showing internal components of an electronic control unit controlling a copying machine.

All the units described above are associated with the electronic control unit 9 for operation in response to the commands from the electronic control unit 9 thereby performing copying of the original OR. As illustrated in FIG. 5, the electronic control unit 9 accommodates therein known CPU (central processing unit) 90a, ROM (read only memory) 90b, RAM (random access memory) 90c and a common bus 90d, establishing an arithmetic logic operating circuit. The common bus 90d interconnects CPU 90a and all other control circuits such as a scanner control circuit 91 for controlling the scanner unit 1, a Xerography circuit 92 for controlling the Xerography unit 1, an exposure control circuit 93 for controlling the exposure unit 3, a first paper feed control circuit 95 for controlling the first paper feed unit 5, a second paper feed control circuit 97 for controlling the second paper feed unit 7, and a fixing control circuit 98 for controlling the fixing unit 8. Thus, the CPU 90a drives actuators within these units such as the solenoid 79 in the paper feed unit 7 as well as a number of motors, not shown, to cause the individual units to perform the required operations.

Figure 6:
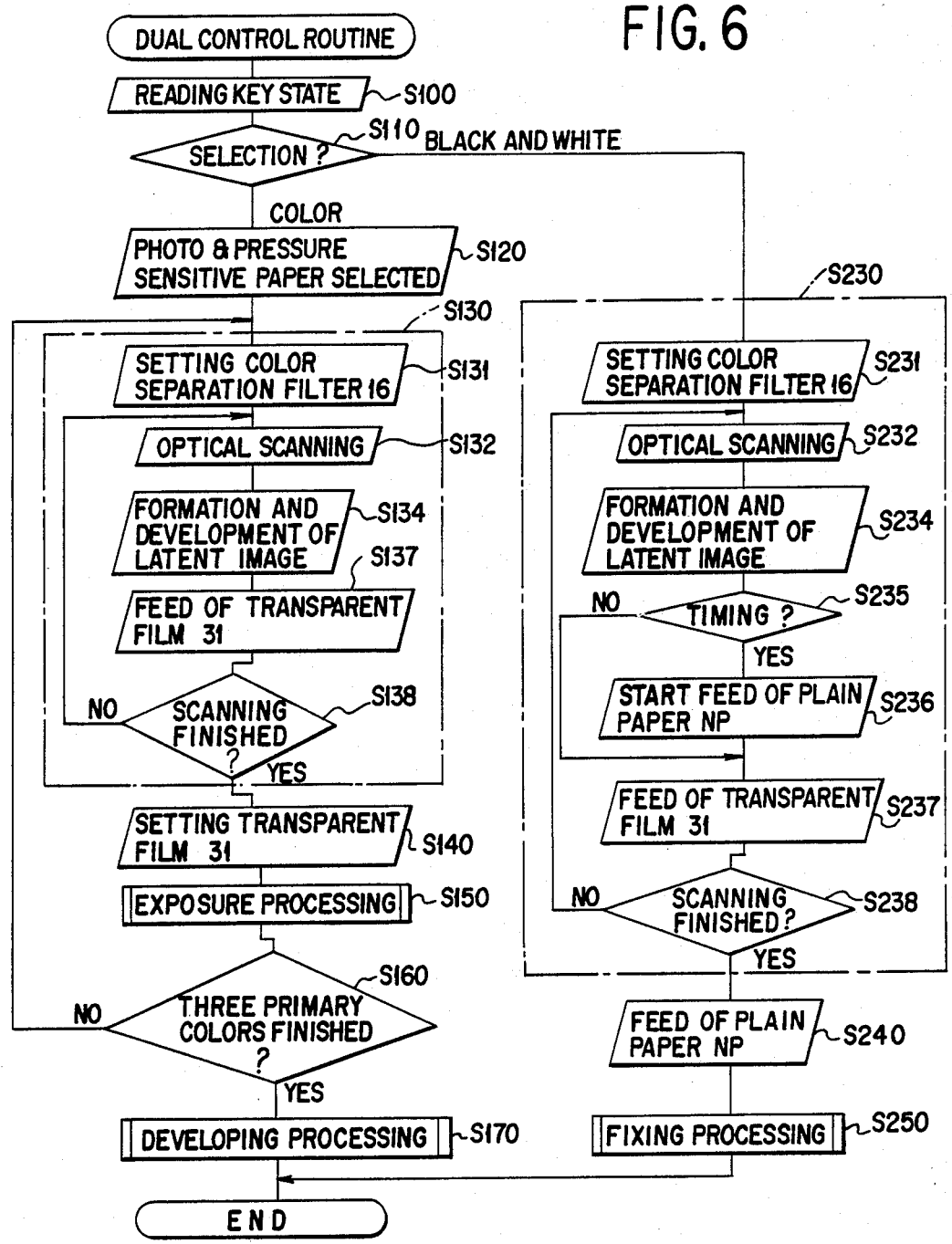
FIG. 6 is a flow chart showing a copying control routine.

For copying the original OR, the electronic control unit 9 executes the control routine illustrated in FIG. 6. This allows the units to cooperate with one another to generate color or monochrome copies of the original OR.

In the procedures of copying, as soon as the electronic control unit 9 receives a command for copying through operation of a key, it initiates the control routines shown in the flow chart of FIG. 6. As shown in FIG. 1, the copying machine has a cluster of keys KB provided on top of its housing, one of which is used to select one of the two copying styles.

It first reads the state of the key (step S100) to determine which of color or monochrome copying is desired (step S110). Reading the state of the key thus indicating the selection, when color copying is desired, the paper feed unit 5 is first controlled to send a piece of photo and pressure sensitive paper OP to the electrostatic unit 55 where the paper OP is held in position by electrostatic effect (step S120).

The procedure then goes to the step S130, image formation processing. In particular, the color separation filter 16 within the scanner unit 1 is set to a certain color (red at first: step S131), followed by optical scanning of the original OR (step S132). At the same time, the Xerography unit 2 is operated to perform formation and development of a latent iamge through rotation of the drum 20 (step S134) as well as feeding the transparent film 31 to the exposure unit 3 in synchronism with rotation of the drum 20 (step S137), such procedures (step S132 and S137) being continued until the end of scanning the original OR (step S138). When scanning is completed, toners 25 are deposited on the areas of the transparent film 31 that correspond to the areas which appear black as they are seen through the red color separation filter 16 on the original OR. That is, toners 25 do not deposit on the area that corresponds to the red part of the image on the original OR when it is separated into additive primary colors (white area is therefore included).

The transparent film 31 with toners deposited thereon is thus traveled and is brought to a stop when the toner image arrives right under the illumination unit 40 (step S140). The filter 43 within the illumination unit 40 is then turned to locate the area with the same color as that of the color separation filter 16 used for scanning right under the exposure lamp 41. Exposure then takes place with the exposure lamp 41 kept lit for a given period of time (3 seconds in this embodiment: step S150). The paper OP is thus exposed to light through an image separated into each color component: With the red filter 43, for instance, red light is passed through the area with no toner deposited, thereby setting some of the microcapsules on the paper OP that have a compound sensitivity peak at the wavelength of 650 nm, i.e., those containing a cyan developing substance. Naturally, light is prevented from passing through the area with toners 25 deposited, so that setting the microcapsules does not take place at the area of the paper OP under the toner-deposited area.

When the step S150 is completed, a procedure checks to see if scanning associated with color separation of the original OR, formation of the latent image, development, transfer and exposure have been accomplished for all the primary colors (step S160). If not, the steps S130 to S150 are repeated until all are finished. This makes other microcapsules on the paper OP than explained above (magenta and yellow) to be exposed. When all the procedures are complete for the three primary colors, the paper feed unit 5 is controlled to discharge static electricity so that the paper OP after exposure is sent to the pressure roller pair 60 and 61 (step S170).

The paper OP is pressurized by the pressure rollers 60 and 61 so that the microcapsules remaining uncured are mechanically ruptured. As a result, the chromogenic material enveloped therein is squeezed out of the microcapsule and reacts to the developing agent applied to the base layer of the paper OP for color development. A bright-colored reproduced image is thus created on the paper OP. After the procedure in step S170, this control routine is terminated.

When, on the other hand, monochrome copies are selected by the key, the procedures goes from step S110 to step S230 and following ones for one-time execution of the procedure like the image formation procedure described above (step S130). Within the step S230, the transparent section of the color separation filter 16 is selected in the scanner unit 1 (step S231). This performs scanning the original OR (step S232), formation and development of the latent image (step 234), while at the same time, the step S235 determines if the rotary position of the drum 20 is ready to feed a piece of plain paper NP. When it becomes ready, the paper feed unit 7 is controlled to open the registration gate 78 to convey the paper NP to the transparent film 31 (step S236). Feeding the transparent film 31 is controlled simultaneously with these procedures (step S237) and the steps S232 to S237 are continued until the end of scanning.

With these procedures, the image on the original OR is separated between black and white, and toners 25 are deposited on the area of the drum 20 that corresponds to the area identified as black of the original OR. The toners 25 are transferred to the paper NP at the point where the transfer roller 34 presses the paper NP against the drum 20 by way of the transparent film 31.

After completing the procedure of step S230, the transparent film 31 is further moved to send the paper NP with the toners 25 transferred thereon to the fixing unit 8 (step S240). Because a substantially large curvature of the transparent film 31 is tangentially contact with the drive roller 33, discharging with the discharge corotron 37 and presence of the stripper finger 81, the paper NP is surely peeled off the transparent film 31 at this position and is carried into the fixing unit 8.

The fixing unit 8 is then controlled to heat the heat roller 82 to a certain high temperature. The paper NP is held between and forwarded by this heat roller 82 and the pressure roller 83 (step S250). As a result, the toners 25 transferred to the paper NP is fused thereon to fix a black and white image thereon. After this procedure, this control routine is terminated.

As fully described in the foregoing, with the copying machine embodying the invention, both of color reproduction with the photo and pressure sensitive paper OP, and monochrome reproduction with the plain paper NP can be obtained by selection with the key operation. Since, for monochrome reproduction, the toner 25 used for development of the latent image as the light-shield materials can be directly deposited on the plain paper NP, the time required for copying is significantly reduced, with cut-off of running cost for monochrome copying.

Also, the transparent film 31 of the exposure unit 3 is used to transfer the toners 25 to the plain paper NP and to send the paper NP further to the fixing unit 8. This obviates any necessity of a separate conveying mechanism for the paper NP, providing the more simplified structure and arrangement. Exposure of the photo and pressure sensitive paper OP takes place through the transparent film 31 and toners 25 thereon, which assures a longer service life of the drum 20 with little problem of deterioration due to exposure to a stronger light.

Figure 7:
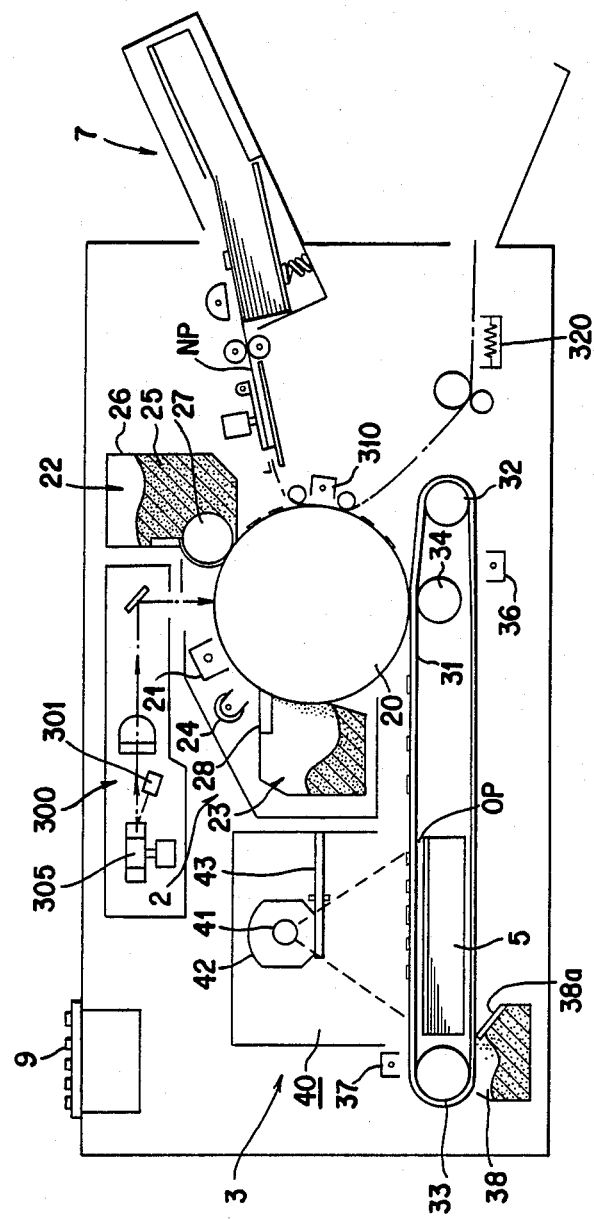
FIG. 7 is a schematic structural view showing a modified copying machine embodying the invention.

In spite of the above description, the image recording device of the present invention is not limited to the copying application but can be used as an image recording device with a laser scanner unit 30 replaced for the scanner unit 1, as illustrated in FIG. 7. In such an image recording device, laser beam from the laser 301 is sent to a rotary polygonal mirror 305. Reflections from the polygonal mirror 305 scan the photo-conductive drum 20 of the Xerography unit 2 to write an image thereon (formation of a latent image), whereby color reproduction takes place on the photo and pressure sensitive paper OP and monochrome reproduction on the plain paper NP.

Formation of a latent iamge can be provided by other processes such as an LED (light emitting diode) array or liquid-crystal array system. The filter 43 of the illumination unit 40 within the exposure unit 3 can be replaced with individual lamps whose peak wavelengths are 450, 550, and 650 nm, respectively. Obviously, exposure of the photo and pressure sensitive paper OP is not limited to such three primary colors but can be a single color or a light outside the visible range such as ultraviolet lights with different wavelengths in dependence on the properties of the microcapsules carried on the photo and pressure sensitive paper OP.

Alternatively, the plain paper NP sent from the paper feed unit 7 may be brought into contact with the drum 20 via a separate route without any transparent film 31 of the exposure unit so as to provide toner transfer using a charging corotron 310 and setting using a heater 320.

Although in the foregoing embodiments, the so-called self-developement type photo and pressure sensitive paper is used, a so-called transfer type photo and pressure sensitive paper such as disclosed in the U.S. Pat. No. 4,399,209 may be used for color copying or image recording. In this case, a transfer sheet coated with the developing agent is seprarately prepared while the photo and pressure sensitive paper itself is merely coated with microcapsules. Accordingly, it becomes necessary for the recording device to be equipped with a transfer paper feeding mechanism for feeding the transfer paper so that the transfer paper and the photo and pressure sensitve paper are passed through the pressurising rollers in a superposed state.

As described above, the image recording device embodying the invention has a particular advantage in that image recording on the photo and pressure sensitive paper (color copying for instance) and image recording on the plain paper can easily be selected by a simple arrangement of developing the latent image useing light-shield materials. This enables the device of the invention to provide both of the multi-function image recording facility with the photo and pressure sensitive paper and the quick and inexpensive image recording facility with the plain paper.

What is claimed is:

1. An image recording device comprising:
   select means for selecting either a photo-sensitive paper or a plain paper as a recording medium;
   light-shield image forming means for forming a provisional image with light-shield materials;
   monochrom image forming means for forming a monochrom image on said plain paper by transferring said light-shield image onto said plain paper if said plain paper is seleced as the recording medium by said select means; and
   color image forming means for forming a color image on said photo-sensitive paper by exposing said light-shield image onto said photo-sensitive paper if said photo-sensitive paper is selected as the recording medium.

2. The device according to claim 1 wherein said color image forming means comprises an image carrier, and wherein said light-shield image is transferred onto said image carrier, said light-shield image carried on said image carrier being exposed onto said photo-sensitive paper.

3. The device according to claim 2 wherein said optical image forming means further comprises exposure means for exposing said light-shield image carried by said image carrier onto said photo-sensitive paper, and wherein said image carrier conveys said light-shield image from a first place where said light-shield image is transferred thereonto to a second place where said exposure means exposes said photo-sensitive paper.

4. The device according to claim 3 which further comprises first paper feed means for feeding said photo-sensitive paper to said second place, said photo-sensitive paper being fed in the direction acrossing the direction in which said image carrier transferring conveying said light-shield image.

5. The device according to claim 4 wherein a latent image is formed on said photo-sensitve paper by said exposure, and wherein said image recording device further comprises developing means arranged downstream of said second place in the feeding direction of said photo-sensitive paper, said latent image on said photo-sensitive paper being developed by said developing means.

6. The device according to claim 4 wherein said monochrom image forming means comprises second paper feed means for feeding said plain paper to said first place so that said plain paper is superposed on said image carrier, whereby said light-shield image is transferred on said plain paper at said first place.

7. The device according to claim 6 which further comprises fix means for fixing said light-shield image transferred on said plain paper, said fix means being arranged downstream of said second place in said direction of conveyance of said light-shield image by said image carrier, and wherein said image carrier conveys said plain paper from said first place to said fix means.

8. The device according to claim 3 wherein said color image forming means further comprises positioning means for electrostatically positioning said photo-sensitive paper at said second position.

9. The device according to claim 2 wherein said light-shield image forming means comprises a drum, said light-shield image being formed on the circumferential surface of said drum, and wherein said light-shield image is selectively transferred onto said plain paper or said photo-sensitive paper, each of which contacts said cirdumferential surface of said drum at a different area.

10. The device according to claim 1 wherein said photo-sensitive paper comprises a photo and pressure sensitive paper coated with microcapsules, each of said microcapsules enveloping therein a chromogenic material for cyan, magenta or yellow as well as a photo-curable resin, said photo and pressure sensitive paper further being coated with a developing agent which reacts to said chromogenic material to develop a color.

* * * * *